United States Patent [19]

Holm et al.

[11] 4,431,475
[45] Feb. 14, 1984

[54] PROCESS FOR MAKING DOPED SEMICONDUCTORS

[75] Inventors: Claus Holm, Teising; Erhard Sirtl, Marktl, both of Fed. Rep. of Germany

[73] Assignee: Consortium fur Elektrochemische Industrie GmbH, Munich, Fed. Rep. of Germany

[21] Appl. No.: 359,281

[22] Filed: Mar. 18, 1982

[30] Foreign Application Priority Data

Apr. 29, 1981 [DE] Fed. Rep. of Germany ....... 3117072

[51] Int. Cl.³ ..................... C30B 23/06; C30B 27/00; C30B 31/08; C30B 31/12
[52] U.S. Cl. .................................. 156/606; 156/612; 156/DIG. 73; 156/DIG. 89; 427/85; 427/86
[58] Field of Search ....... 156/605, 606, 612, DIG. 64, 156/DIG. 73, DIG. 89; 427/85, 86

[56] References Cited

U.S. PATENT DOCUMENTS

| 3,484,302 | 12/1969 | Maeda et al. | 156/DIG. 64 |
| 3,663,722 | 5/1972 | Kamath | 156/605 |
| 4,279,669 | 7/1981 | Braun et al. | 427/86 |

FOREIGN PATENT DOCUMENTS

| 2642813 | 3/1978 | Fed. Rep. of Germany | 156/606 |
| 2738111 | 3/1979 | Fed. Rep. of Germany | 156/DIG. 73 |
| 53-11574 | 2/1978 | Japan | 156/606 |

*Primary Examiner*—Bradley Garris
*Attorney, Agent, or Firm*—Allison C. Collard; Thomas M. Galgano

[57] ABSTRACT

A process for making doped semiconductor bodies in thick sheets by epitaxial growth of a doped monocrystalline semiconductor layer on a substrate body by means of a transfer reaction, the transfer system being so arranged that dead spaces are avoided and that within the transfer system a gradient of maximally 1° C./mm is maintained. The invention makes it possible to obtain doped layers of larger thickness than heretofore known.

6 Claims, 4 Drawing Figures

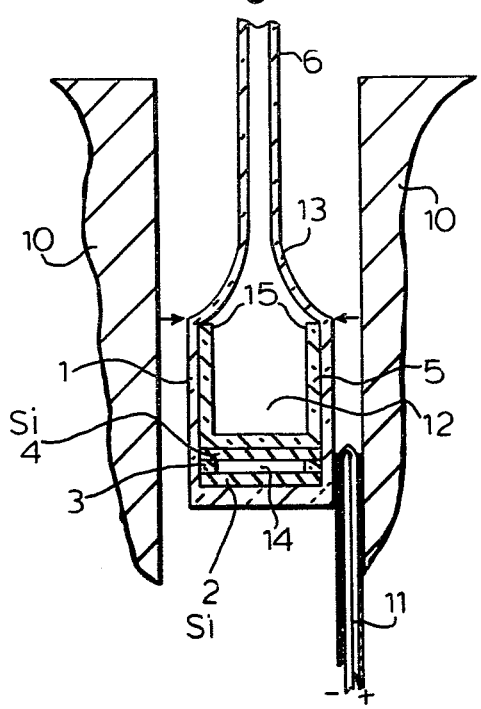
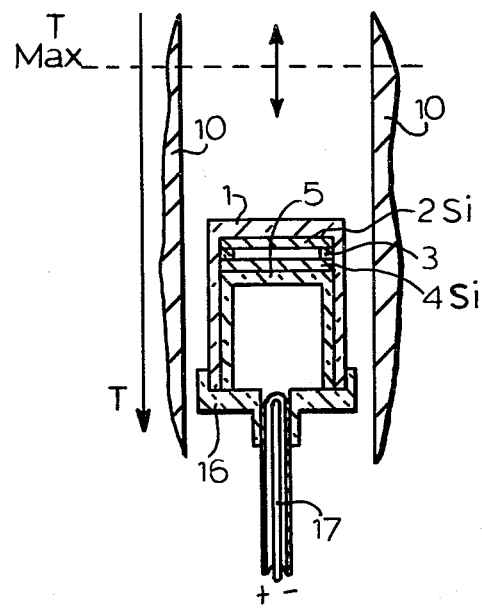
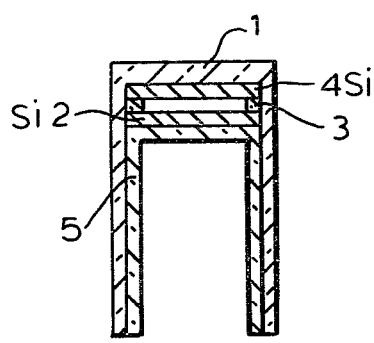

PROCESS FOR MAKING DOPED SEMICONDUCTORS

The invention relates to a process for making doped semiconductors in a closed system by epitaxial growth of a doped monocrystalline semiconductor layer on a monocrystalline semiconductor sheet A serving as a substrate. The process is carried out by means of a transfer reaction of gaseous doping material with a second semiconductor B serving as a source of semiconductor material and, if necessary, an auxiliary material used as an agent for bringing about the transfer.

A process for making thin, monocrystalline semiconductor layers by epitaxial growth on semiconductor sheets serving as substrate has already been described in J. Phys. Chem. Sol. 24, 1963, 1285; in this process, the transfer reaction is carried out from a second semiconductor disc, which is generally arranged at a distance of about 0.1 mm from the substrate disc. In this case, the two discs have a temperature difference of 20° to 100° C. The gaseous substances effecting the transfer communicate with a gas volume which is much larger than the transfer arrangement proper. In the above-mentioned publication, it is stated that this process, also called the "Sandwich Method" is useful for making thin, doped monocrystalline semiconductor layers.

It is an object of the present invention to provide a doping process which makes it possible to obtain doped monocrystalline semiconductor material in thick layers. By "thick" layer, it is to be understood that more than 100 μm, especially more than 500 μm, are meant.

The invention therefore relates to a process for making doped semiconductors in a closed system by epitaxial growth of a doped monocrystalline semiconductor layer on a monocrystalline sheet A serving as a substrate, the process being carried out by means of a transfer reaction in the presence of a gaseous doping material with an auxiliary material used as an agent for promoting the transfer, if necessary, and a second semiconductor body B serving as semiconductor material source. The inventive method is carried out as follows: The two semiconductors A and B are so arranged in the closed system that they do not touch, with the surfaces accessible for an exchange of material being formed substantially by the surface of B and the surface of A which is destined for the epitaxial growth; the free volume of the closed system is formed by the free space between the two semiconductors A and B and within this space a temperature gradient of maximally 1° C./mm is maintained in the direction of the transfer of material.

As semiconductor material for the substrate, monocrystalline, doped silicon or germanium is used, preferably silicon.

For the body which serves as a semiconductor material source, either polycrystalline or monocrystalline semiconductor material may be used, the latter being preferred, with the semiconductor material mainly used being silicon or germanium. In the case of silicon, boron- or phosphorus- doped silicon may be used, if desirable, particularly if a basic doping is to be imprinted. Doping with the material according to the invention is, in this case, an additional doping.

The semiconductor bodies (both source and substrate) are made with planar ground sections, so that they can be arranged in a plane parallel manner relative to one another. The semiconductor bodies are mostly used in the form of discs or cylinders. They consist preferably, but not exclusively, of the same semiconductor material.

The doping materials according to the invention are:

The elements of the 6th main group of the periodic system, preferably sulfur, selenium and tellurium.

The elements of the 3rd main group and the 2nd subgroup, particularly in the form of their iodides. It is frequently advantageous to prepare the mentioned compounds in the reaction system proper from their elements.

As transfer-promoting auxiliary agent, elementary iodine is particularly useful. By the expression "doping material", those substances should be understood which are applied in the doping reaction. Thus, for instance, when iodides of the 3rd main group or the 2nd subgroup are used in the doping reaction, only the element, and not the compound, is implanted. This makes it necessary to distinguish between the doping agent and the chemical nature of the doping substance.

In the arrangement of the two semiconductor bodies A and B, and the device enclosing the same, it is important, according to the invention, that compared to the volume limited by the two bodies the residual volume in the closed system be so small as to be negligible. It is thereby accomplished that the surfaces accessible to exchange of material, including the walls forming the closed system, consist essentially of the surface of body B (the source of semiconductor material) and the surface of body A (for epitaxial growth).

Thus, according to the invention, source and substrate form a narrowly limited transfer system. It is possible to arrange several such systems in a series in the same apparatus. It is, however, essential that within each transfer system, a temperature gradient of maximally 1° C./mm, preferably 0.2° C./mm, be maintained.

Whereas the temperature gradient according to the invention is to be maintained within very narrow limits, the absolute temperature range is comparatively not critical. The upper limit lies, of course, closely below the melting temperature of the semiconductor and the lower limit is at about two thirds of the numerical value of the melting temperature, indicated in °C. For reasons of design of the apparatus, the temperature preferably should not exceed 1200° C.

In order to keep the apparatus as small as possible, it is advantageous to determine, in a preliminary test, the temperature profile of the heating device and to place the transfer system exactly at the spot where the temperature gradient is maximally 1° C./mm.

Suitable heating devices are, for instance, furnace tubes of 30 cm. in length or longer. In this case, the temperature profile is determined by measuring the temperatures along the axis of the tube by means of thermoelements, e.g. platinum/platinum-rhodium elements.

The epitaxial growth of the doped semiconductor layer occurs by transfer of the semiconductor material serving as a source onto the semiconductor serving as a substrate, by a transfer reaction, as mentioned before. At the conditions prevailing according to the invention the doping material or, if present, the agent promoting transfer, reacts with the source of semiconductor material with the formation of a gaseous reaction mixture. This gas mixture decomposes in contact with the substrate body of different temperature whereby a monocrystalline layer is formed, into which the doping material is implanted according to its solubility at the given temperature and pressure conditions. The content of doping material lie as a rule in the range of $10^{15}$ to $10^{18}$ atoms/cc semiconductor material.

The pressures generated in the system by the doping material and the transfer promoting agent are mostly between 0.01 and 10 bar.

In principle, the transfer reactions can occur from hot to cold or from cold to hot. The appropriate adaptation depends on the transfer behavior of the doping material. By selecting appropriate pressure and temperature conditions, the synchronized transfer behavior is forced upon the semiconductor material to be transferred.

When elements of the 6th main group of the periodic system are used as the doping material, the direction of the transfer is always from hot to cold. Consequently, the transfer system is arranged in such a manner that the semiconductor source is maintained at higher temperatures than the substrate body. To the chalcogenes, iodine can be added as a transfer promoting agent, but this is not mandatory. The function of this auxiliary agent is substantially to convert the semiconductor material into a volatile iodine compound, but the iodine is not implanted into the substrate body as a doping agent.

The iodine pressure is kept within the system at values above 0.1 bar. Below 0.1 bar, the transfer direction is reversed, especially when silicon or germanium are used as the semiconductor material, as a result of which the transfer occurs from cold to hot. The transfer behavior of the semiconductor materials can, therefore, be controlled by the iodine pressure.

The transfer behavior of the iodides of boron, aluminum, gallium and indium is likewise directed from hot to cold. The iodine pressure is selected accordingly, as mentioned above.

Other objects and features of the present invention will become apparent from the following detailed description considered in connection with the accompanying drawing, which discloses several embodiments of the invention. It is to be understood that the drawing is to be used for the purposes of illustration only, and not as a definition of the limits of the invention.

In the drawing, wherein similar reference characters denote similar elements throughout the several views:

FIG. 1 is a schematic sectional view of a device for carrying out the inventive process;

FIG. 2 illustrates the position of the reaction vessel and the transfer system, respectively, within the heating system for the case where the transfer direction is from hot to cold;

FIG. 3 is an enlarged sectional view of the transfer system; and

FIG. 4 illustrates a modified system for making particularly thick epitaxial layers.

Referring to FIG. 1, the vessel containing the transfer system or arrangement according to the invention is designated by reference numeral 1 and is preferably made of quartz. At the bottom of device 1, a disc 2 is mounted which serves as a source of semiconductor material and which, in the following, is called a "supply" disc or "stock" disc. Supported by said disc, is a spacing ring 3 made of quartz, and upon the ring rests a semiconductor disc 4, which is the substrate to be doped. The two discs are arranged in parallel and their distance apart is, as a rule, 0.1 mm. to 1 mm., preferably 0.4 mm. A plunger or piston 5 is inserted or introduced into vessel 1, and it lies above disc 4; it serves as a means for reducing the volume of the transfer system. The substrate disc 4 lies in direct contact with the head of plunger 5 so that there will not be any dead space between the disc and the plunger. In other words, there is a perfect fit between the vessel (and plunger) and the transfer system.

Above the upper corner 15 of plunger 5, the vessel 1 tapers and merges into a tube 6 which ends at a connection 7 to a vacuum pump (not shown). Within tube 6, the doping material 8 is placed; sometimes there is a special niche or recess in a curvature 9 for receiving the doping material. If the doping material is a volatile substance, it can be kept at this time in an ampule 8a or a piece of a capillary tube or the like.

In order to remove superficial impurities (particularly oxidic impurities) from the semiconductor discs, vacuum is applied to the vessel and the discs are heated in the furnace 10 while under subatmospheric conditions. The heating temperature lies usually in the temperature range, in which doping is carried out, and it is controlled by a thermo-element 11. The part of the apparatus, which receives the doping material, is in this phase preferably outside of the heating device. After completion of the heating, the tube 6 is melted away between the receptacle 8a for the doping material and the vacuum connection 7, whereby the reaction vessel remains evacuated. After the vessel has been allowed to cool down, the doping material is brought to the area 12 of the plunger 5, whereupon another melting away is carried out at the spot 13 where tube 6 and vessel 1 merge. The remaining reaction vessel is then heated in the range of the doping material and simultaneously cooled in the range of the semiconductor discs, in order to bring about condensation of the doping material in the reaction system proper, especially in the free space 14. In case the doping material was introduced into the transfer system, e.g., in a molten state in a capillary, heating is continued, until the capillary is destroyed by the internal pressure obtained.

After the condensation step, the upper edge of the plunger is melted to the outer wall of the vessel 1. This concludes the preparations for the doping proper.

FIG. 2 shows the positioning of the reaction vessel within the heating device, e.g., a tubular furnace 10. The transfer shown occurs from hot to cold. After having measured the temperature profile of the furnace, the reaction vessel 1 is placed, preferably in vertical position, on a stand 16 to that spot in the heating system where a temperature gradient of 1° C./mm is obtained. Because of the convection current within the transfer system, it is advantageous to arrange the supply disc 2 above the disc 4 to be doped. The stand 16 may be provided with a thermo-element 17. The arrow T illustrates the temperature profile.

As mentioned before, FIG. 3 shows the transfer system in detail, corresponding parts being designated by the same numerals as in FIG. 1.

FIG. 4 illustrates the essential parts used in a modified embodiment by which a particularly thick doping layer, e.g. of 1 cm, is to be made. The semiconductor body 2' is the supply disc which is so shaped that it can be slipped onto a comparatively high spacing ring 3' without the distance between the supply body and the substrate body 4' exceeding 1 mm. The doped body will, in this case, adopt the shape dictated by the internal shape of the spacing ring 3'.

With the process according to the invention, it is possible to obtain monocrystalline semiconductor bodies which are homogenously doped in a thick layer both in a radial, as well as an axial direction. The doping will cause a change, e.g., of the electrical or the optical properties. For instance, silicon doped with tellurium, made according to the invention, can be used as an infrared detector.

In the following, the invention will be more fully described by several examples, but it should be understood that these are only given by way of illustration and not of limitation.

EXAMPLE 1: n-Doping of Monocrystalline Silicon with Tellurium

The device as shown in FIG. 1 is used. A disc of 1 mm thickness of monocrystalline, zone-melted silicon is used as a substrate disc 4' having a diameter of 30 mm. The semiconductor source 2' consists of a cylindrical body of 10 mm height, which is provided with a cut for receiving the spacing ring, as shown in FIG. 4. The semiconductor source or supply body likewise consists of monocrystalline silicon.

The two semiconductor bodies 2', 4' are arranged in the quartz vessel or ampule 1 at a distance of 0.4 mm apart in a plane parallel position. A quartz ring 3' serves as a spacer. The doping material used is 1.2 mg elementary tellurium, corresponding to $10^{-5}$ gram equivalents.

At first, the silicon bodies are heated at 1200° C. in a high vacuum. After cooling, while still under vacuum, the tellurium supply is shaken into the bottom part of the reaction vessel 1. Then still under vacuum conditions, the vessel is melted away at the merging area 13 of the tube 6. The tellurium is now heated to about 300° C. and condensed in the free space between the two silicon bodies 2', 4'. In order to decrease the reaction space, the upper edge of the plunger 5 is melted to the wall of the ampule 1.

The so-obtained container is placed on a stand 16 and transported into a tubular furnace of 50 cm length, whose temperature profile had been measured before.

At first, the ampule 1 is arranged within the furnace in such a manner that the substrate disc 4', i.e., the disc to be doped, is heated to higher temperatures than the supply disc 2'. Thereby, a transfer reaction is started from the substrate disc 4' in the direction of the body 2' which, per se, is meant to serve as source for the semiconductor material. By this transfer reaction, which, in fact, occurs in reverse direction, the uppermost layers of the substrate disc 4' are removed in order to obtain a substrate surface with as few crystal faults as possible. After about 30 minutes, the ampule 1 is shifted within the furnace to a place such that now the substrate disc 4' becomes the colder part of the transfer system. The temperature gradient, measured indirectly by way of the temperature profile of the furnace, amounts to 0.1° C./mm; the temperature is about 1200° C.

The system is maintained for a period of 8 days at the conditions described.

Finally, a disc 4' of about 5 mm thickness is obtained, which is doped in a layer of about 4 mm with tellurium, whose concentration in the doped range is $10^{17}$ tellurium atoms/cc of doped silicon. The specific resistance of the doped silicon is 0.2 $\Omega$cm.

Comparison Example 1

The procedure in Example 1 is repeated with the alteration that the temperature gradient is 25° C./mm. This results in a temperature difference of the two silicon bodies in plane parallel arrangement of at least 10° C.

A disc is thereby obtained which only in the first epitaxial layer of about 100 $\mu$m is monocrystalline. In the further epitaxial layer, displacements and staple faults are clearly visible under the microscope. This shows that under these conditions the growth of oriented monocrystals preferably occurs.

EXAMPLE 2: Doping with Indium via Transfer Reaction

The arrangement is the same as in Example 1. The following changes are observed:

The temperature for condensation of the doping material into the reaction system is 500° C.

The doping material consists of 0.6 mg indium and 1.8 mg of elementary iodine is used as an auxiliary agent promoting transfer.

The doping temperature proper is 1200° C. The temperature gradient maintained is about 0.2° C.

After 10 days, a monocrystalline silicon disc is obtained, which has a thickness of about 2 mm and which is homogeneously doped with indium in a layer of about 1 mm thickness.

The concentration in doping material is $10^{17}$ indium atoms per cc of doped silicon; the specific resistance of the doped layer is 0.1 $\Omega$cm.

While only a few embodiments and examples of the present invention have been shown and described, it is obvious that many changes and modifications may be made thereunto without departing from the spirit and scope of the invention.

What is claimed is:

1. In a process for making doped semiconductor bodies in a closed system by epitaxial growth of a doped monocrystalline semiconductor layer on a monocrystalline semiconductor body A by a transfer reaction from a semiconductor body B serving as a source for semiconductor material, in the presence of doping material in a gaseous state, the improvement comprising the steps of:
    arranging the two semiconductor bodies A and B within said closed system in a contact-free manner, with the surfaces capable of exchange of material facing one another and providing a free space between said surfaces for the reaction to take place; and
    maintaining within said space a temperature gradient, in the direction of material transfer, of maximally 1° C./mm, thus producing a doped, monocrystalline semiconductor layer of a thickness of at least 100 $\mu$m.

2. The process according to claim 1, wherein elementary silicon is used as the semiconductor material.

3. The process according to claim 1, wherein the doping material is selected from the elements of the 6th main group of the periodic system.

4. The process according to claim 1, wherein the doping material is selected from the group consisting of iodides of the 3rd main group of the elements of the periodic system.

5. The process according to claim 1, wherein the doping material is selected from the group consisting of iodides of the second sub-group of the elements of the periodic system.

6. The process according to claim 1, wherein as transfer promoting agent, elementary iodine is used.

* * * * *